US007944258B2

United States Patent
Oh

(10) Patent No.: US 7,944,258 B2
(45) Date of Patent: May 17, 2011

(54) SEMICONDUCTOR INTEGRATED CIRCUIT INCLUDING DELAY LINE OF DELAY LOCKED LOOP AND METHOD OF CONTROLLING DELAY TIME USING THE SAME

(75) Inventor: Young-Hoon Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 131 days.

(21) Appl. No.: 11/647,467

(22) Filed: Dec. 29, 2006

(65) Prior Publication Data

US 2007/0296473 A1    Dec. 27, 2007

(30) Foreign Application Priority Data

Jun. 27, 2006   (KR) .................. 10-2006-0057829

(51) Int. Cl.
*H03L 7/06* (2006.01)
(52) U.S. Cl. ..................... 327/158; 327/156
(58) Field of Classification Search .............. 327/158, 327/156, 182, 183, 261–290
See application file for complete search history.

(56) References Cited

U.S. PATENT DOCUMENTS

| | | | |
|---|---|---|---|
| 6,373,304 B1* | 4/2002 | Drost et al. | 327/157 |
| 6,556,488 B2 | 4/2003 | Han | |
| 6,791,384 B2 | 9/2004 | Iwashita | |
| 7,132,866 B2* | 11/2006 | Jiang | 327/158 |
| 2002/0075048 A1* | 6/2002 | Miyamoto | 327/158 |
| 2006/0284656 A1* | 12/2006 | Yu et al. | 327/156 |

FOREIGN PATENT DOCUMENTS

| | | |
|---|---|---|
| JP | 11-205131 | 7/1999 |
| JP | 2001290555 | 10/2001 |
| JP | 2002314407 | 10/2002 |
| JP | 2004-350116 | 12/2004 |
| JP | 2005323323 | 11/2005 |
| KR | 1020040050539 | 6/2004 |
| KR | 1020050014926 | 2/2005 |

* cited by examiner

*Primary Examiner* — Lincoln Donovan
*Assistant Examiner* — Diana J Cheng
(74) *Attorney, Agent, or Firm* — Venable LLP; Jeffri A. Kaminski

(57) ABSTRACT

A semiconductor integrated circuit includes a delay line of a delay locked loop. The delay line of the delay locked loop includes a delay variation detecting unit that outputs a detection signal according to a variation in delay time using a reference clock signal, and a plurality of delay units that change a delay time according to the detection signal and delay the output of an input signal by the changed delay time.

9 Claims, 5 Drawing Sheets

PRIOT ART

SEMICONDUCTOR INTEGRATED CIRCUIT INCLUDING DELAY LINE OF DELAY LOCKED LOOP AND METHOD OF CONTROLLING DELAY TIME USING THE SAME

BACKGROUND OF THE INVENTION

1. Technical Field

The present invention relates to a semiconductor integrated circuit and a control method thereof, and in particular, to a semiconductor integrated circuit including a delay line of a delay locked loop and a method of controlling a delay time.

2. Related Art

In general, delay lines of a delay locked loop are connected in series and a plurality of delay units having the same delay time are provided.

The delay lines are connected to a delay line control circuit that adjusts the delay time.

As shown in FIG. 1, the delay lines are connected to a delay line control circuit. The delay line control circuit includes a plurality of shift registers 21 to 24, and a plurality of NAND gates ND1 to ND5 having first inputs, to which a clock signal CLK is input, and second inputs to which the outputs of the plurality of shift registers 21 to 24 are correspondingly input.

According to the structure of FIG. 1, if a high signal is output from one of the plurality of shift registers 21 to 24, for example, the shift register 23, the NAND gate ND3 delays and outputs the clock signal by the delay time (hereinafter, referred to as td) defined by the delay unit 13.

If a high signal is output from the shift register 21, the NAND gate ND1 delays and outputs the clock signal by a predetermined time (i.e., 3td) by the delay units 11, 12, and 13.

As shown in FIG. 2, the delay unit 11 according to the related art has two NAND gates. Alternatively, though not shown, the delay unit 11 may have two NOR gates or two inverters. The delay units 12 and 13 have the same structure as the delay unit 11, and thus the descriptions thereof will be omitted.

The NAND gates constituting the delay unit 11 of FIG. 2 are supplied with operating voltages VDD and VSS upon operation. The operating voltages are likely to change for various reasons, such as element characteristics, a change in external environment, and the like.

As the levels of the operating voltages change, the delay time changes. A drop in the operating voltage causes an increase in the delay time td, and a rise in the operating voltage causes a decrease in the delay time td. Further, a change in operating temperature may have an effect on the delay time td.

As the number of delay units constituting the delay line increases, the total delay time of the delay line changes considerably.

The delay time of the delay line in the delay locked loop changes according to the operating environment. A change in operating voltage or operating temperature may cause deterioration of the operating performance of the delay locked loop. In particular, when the delay time of the delay line changes considerably, an error in the operation of a semiconductor integrated circuit to which the delay lock loop is applied, for example, an internal clock becoming out of synchronization with an external clock, may occur.

SUMMARY OF THE INVENTION

An embodiment of the present invention may be a semiconductor integrated circuit which may include a delay line of a delay locked loop, which may consistently keep a constant delay time regardless of changes in the operating environment.

Another embodiment of the present invention may be a method of controlling a delay time of a delay locked loop using the semiconductor integrated circuit described above.

According to an embodiment of the invention, a semiconductor integrated circuit may include a delay line of a delay locked loop. The delay line of the delay locked loop may include a delay variation detecting unit that may output a detection signal according to a variation in delay time using a reference clock signal, and a plurality of delay units that may change a delay time according to the detection signal and may delay the output of an input signal by the changed delay time.

Another embodiment of the invention may be a method of controlling a delay time using a semiconductor integrated circuit that may control the delay time of the delay line of a delay locked loop. The delay line of the delay locked loop may include a delay variation detecting unit and a plurality of delay units having a delay time that is variable when using a plurality of signal paths each passing through a respective resistive element from a plurality of resistive elements. The method may include detecting a variation in the delay time of a clock signal by the delay variation detecting unit, and increasing or decreasing the delay time of the plurality of delay units according to the detected variation in delay time.

DESCRIPTION OF EXEMPLARY EMBODIMENT

Hereinafter, an exemplary embodiment of a delay line of a delay locked loop and a method of controlling a delay time is described with reference to the accompanying drawings.

Figure 3:
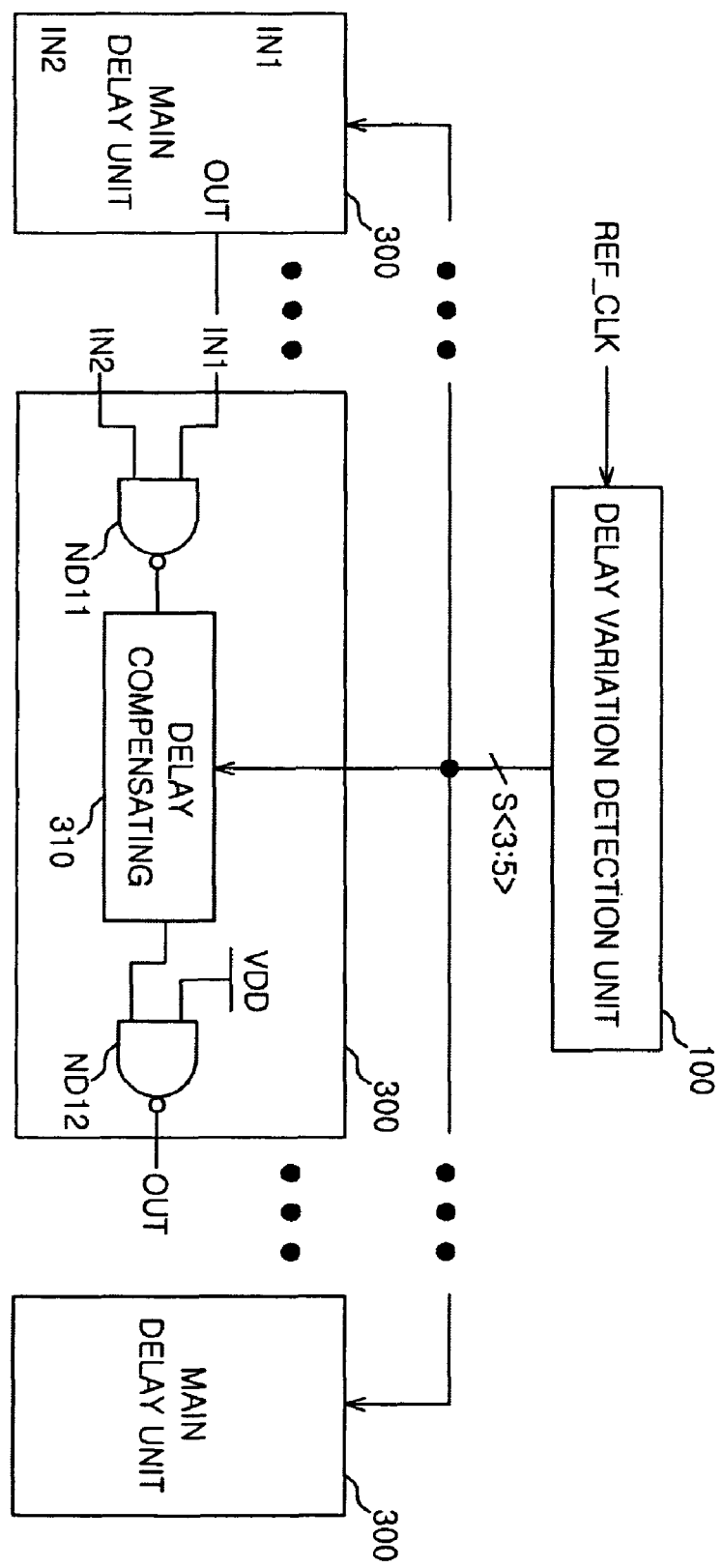
FIG. 3 is an exemplary block diagram of a delay line of a delay locked loop according to an embodiment of the invention.

Referring to FIG. 3, the delay line of the delay locked loop may include a delay variation detecting unit 100 that outputs detection signals S<0:7> according to a variation in delay time using a reference clock signal REF_CLK, and a plurality of main delay units 300 that may change a delay time according to a period corresponding to the detection signals S<3:5> among the detection signals S<0:7>, and delay and output an input signal according the changed delay time.

Figure 4:
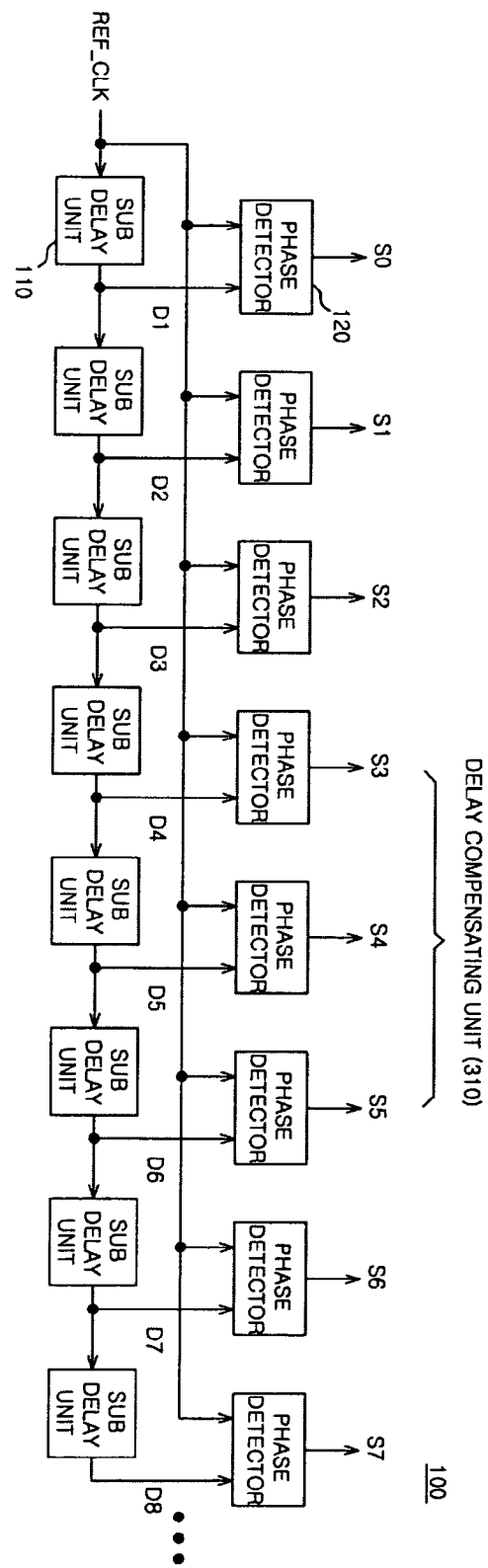
FIG. 4 is an exemplary block diagram of a delay variation detecting unit of FIG. 3.

As shown in FIG. 4, the delay variation detecting unit 100 may include a plurality of sub delay units 110 that may sequentially delay the reference clock signal REF_CLK by a prescribed delay time and output delayed clock signals D<1:8>, and a plurality of phase detectors 120 that may compare the reference clock signal REF_CLK and the delayed clock signals D<1:8> to output the detection signals S<0:7>.

Figure 1:
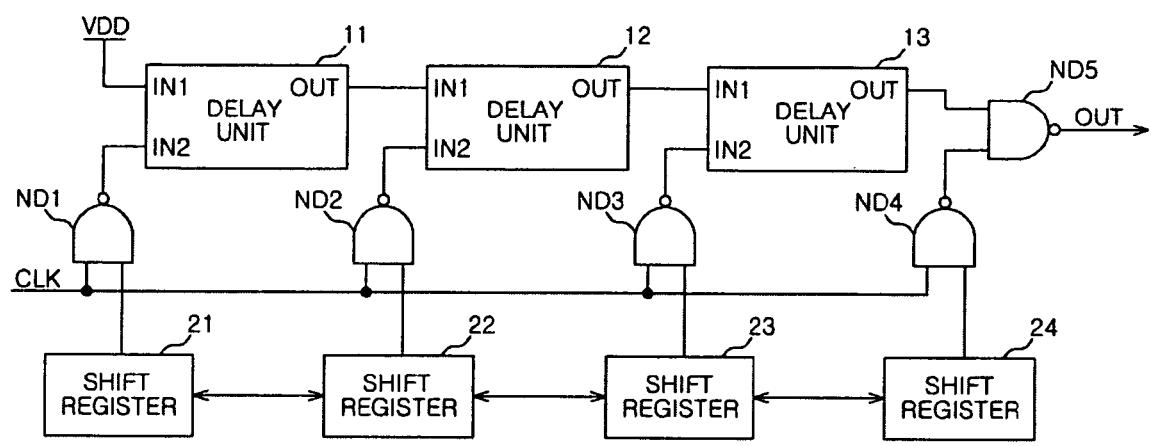
FIG. 1 is a block diagram of a delay line of a known delay locked loop and a control integrated circuit that controls the delay line of the delay locked loop.
Figure 2:
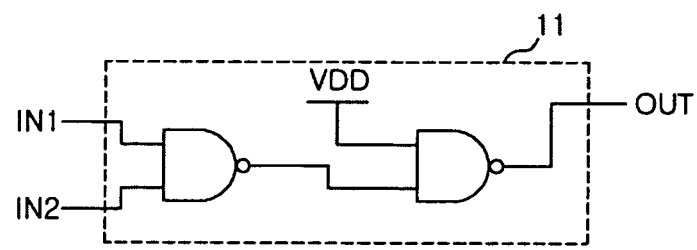
FIG. 2 is a circuit diagram of a delay unit of a delay locked loop according to the related art.

Each of the sub delay units 110 may have structure that detects a change in delay time. In the sub delay unit 110, a unit delay time td may change in response to a change in the operating environment. The sub delay unit 110 may have the same structure as the known delay unit shown in FIG. 2. Although the delay unit has two NAND gates in FIG. 2, the delay unit may include two NOR gates or two inverters.

Figure 5:
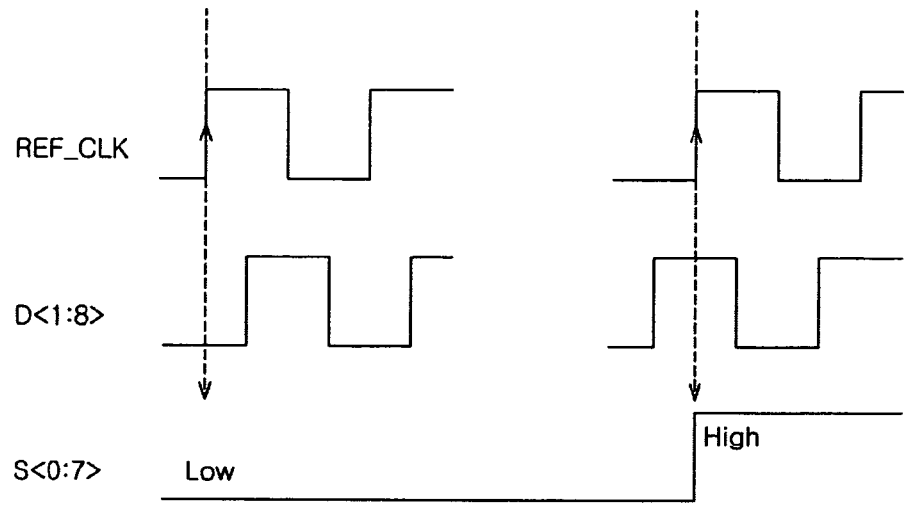
FIG. 5 is an exemplary waveform view showing the operation of a phase detector of FIG. 4.

As shown in FIG. 5, if the reference clock signal REF_CLK is faster than the delayed clock signal D<1:8>, that is, if the delayed clock signal D<1:8> is at a low level at a time at which the reference clock signal REF_CLK is changed to a high level, each of the phase detectors 120 may output the detection signal S<0:7> at a low level. Further, if the reference clock signal REF_CLK is slower than the delayed clock signal D<1:8>, that is, if the delayed clock signal D<1:8> is at a high level at a time at which the reference clock signal REF_CLK is changed to a high level, each of the phase detectors 120 may output the detection signal S<0:7> at a high level.

Figure 6:
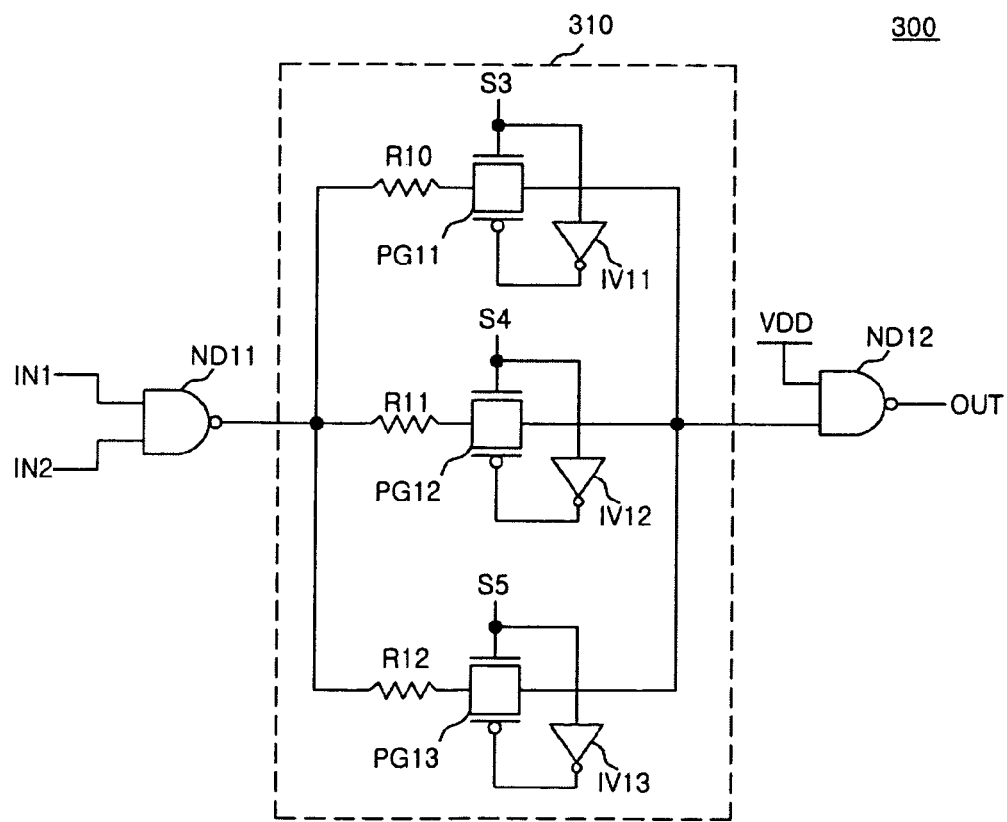
FIG. 6 is an exemplary circuit diagram of a main delay unit of FIG. 3.

As shown in FIG. 6, each of the main delay units 300 may include a first NAND gate ND11, a delay compensating unit 310 that may delay the output of the first NAND gate ND11 by a delay time set according to the period corresponding to the detection signal S<3:5>, and a second NAND gate ND12 that receives the output of the delay compensating unit 310.

Although the main delay unit 300 has two NAND gates in FIG. 6, the main delay unit 300 may have two NOR gates or two inverters.

The delay compensating unit 310 may include a plurality of resistors R10 to R12 having a first end which may receive the output of the first NAND gate ND11, respectively, and a plurality of pass gates PG11 to PG13 having input terminals correspondingly connected to a second ends of the plurality of resistors R10 to R12, control terminals which may receive the detection signals S<3:5> or the inverted detection signals S<3:5>, and output terminals which may be connected to the pass gate PG11 to PG3.

The plurality of resistors R10 to R12 may have the same resistance or different resistances. The resistance of resistors R10 to R12 may be set according to the total delay time of the main delay unit 300. As described below, when it is assumed that the resistors R11 and R12 operate normally when there is no change in delay time as the detection result of the delay variation detecting unit 100 of FIG. 3, the delay time of each of the main delay units 300 is determined by the first NAND gate ND11, the resistors R11 and R12, and the second NAND gate ND12. The main delay unit 300 may be designed such that the delay time of the first NAND gate ND11, the resistors R11 and R12, and the second NAND gate ND12 may be consistent with that in the known delay unit shown in FIG. 2.

Next, the operation of the delay line of the delay locked loop having the above-described structure according to the embodiment of the invention will be described. It may be assumed that the unit delay time td is tck×⅛, and an increase or a decrease in delay time is 0.25×td.

Figure 7:
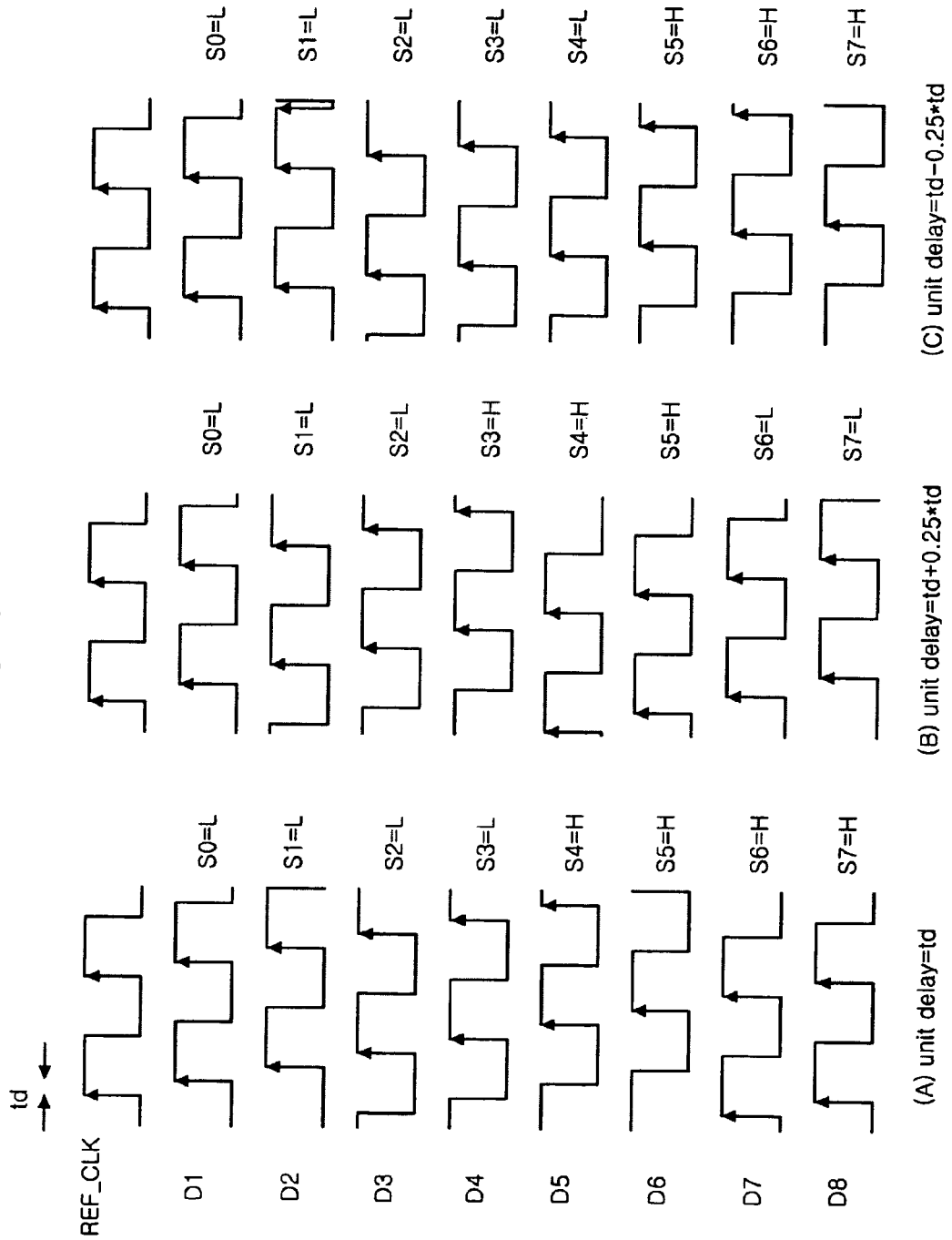
FIG. 7 is an exemplary waveform view showing the operation of the delay variation detecting unit of FIG. 3.

First, when there is no change in the operating environment, that is, when there is no change in the operating temperature and operating voltage, the plurality of sub delay units 110 of the delay variation detecting unit 100 shown in FIG. 4 may sequentially delay the reference clock signal REF_CLK by the unit delay time td and output the delayed clock signals D<1:8>, as indicated by A of FIG. 7. Then, a plurality of phase detectors 120 of FIG. 4 may compare the phases of the delayed clock signals D<1:8> and the phase of the reference clock signal REF_CLK and output the detection signals S<0:7>.

Since the delay time td may be tck×⅛, according to the operation of the phase detectors 120 described with reference to FIG. 5, the detection signals S0 to S3 may be output at a low level, and the detection signals S4 to S7 may be output at a high level.

When the operating voltage decreases, the delay time may increase to td+0.25×td. Accordingly, the plurality of sub delay units 110 of the delay variation detecting unit 100 shown in FIG. 4 may sequentially delay the reference clock signal REF_CLK by td+0.25×td and output the delayed clock signals D<1:8>, as indicated by B of FIG. 7.

The plurality of phase detectors 120 of FIG. 4 may then compare the phases of the delayed clock signals D<1:8> and the phase of the reference clock signal REF_CLK and output the detection signals S<0:7>. The detection signals S0 to S2 may be output at a low level, the detection signals S3 to S5 may be output at a high level, and the detection signals S6 and S7 may be output at a low level.

When the operating voltage increases, the delay time may decrease to td−0.25×td. Accordingly, the plurality of sub delay units 110 of the delay variation detecting unit 100 shown in FIG. 4 may sequentially delay the reference clock signal REF_CLK by td−0.25×td and output the delayed clock signals D<1:8>, as indicated by C of FIG. 7. The plurality of phase detectors 120 of FIG. 4 may then compare the phases of the delayed clock signals D<1:8> and the phase of the reference clock signal REF_CLK and output the detection signals S<0:7>. The detection signals S0 to S4 may be output at a low level, and the detection signals S5 to S7 may be output at a high level.

As will be apparent from the change of the detection signal S<0:7>, in case of A of FIG. 7, a time at which the phase of the delayed clock signal D<1:8> is earlier than the phase of the REF_CLK may correspond to the high level detection signal S4 in the detection signals S<0:7>.

In the case of B having an increased delay time with respect to A of FIG. 7, a time at which the phase of the delayed clock signal D<1:8> is earlier than the phase of the reference clock signal REF_CLK may correspond to the detection signal S3. In addition, in the case of C having a decreased delay time with respect to A of FIG. 7, a time at which the phase of the delayed clock signal D<1:8> is earlier than the phase of the reference clock signal REF_CLK may correspond to the detection signal S5.

It may be possible to determine the increase or decrease in delay time according to the detection signal S<3:5>. In addition, in the detection signal S<3:5>, in the case of A, the number of high levels may be two. Further, in the case of B, the number of high levels may be three, and, in the case of C, the number of high levels may be one. In the case of B, the number of high levels may increase compared with A, and, in the case of C, the number of high levels may decrease compared with A. If the delay time increases, the number of high levels in the detection signal S<3:5> may increase. If the delay time decreases, the number of high levels in the detection signal S<3:5> may decrease.

In this embodiment of the invention, the delay compensating unit 310 of FIG. 6 may be configured using the generation principle of the detection signal S<3:5>. If the number of high levels in the detection signal S<3:5> is large, the resistance becomes smaller, and the delay time may decrease. Otherwise, the resistance becomes larger, and the delay time may increase. As a result, the total delay time of the main delay unit 300 may be consistently kept to the delay time td.

It may be necessary to expand the period of the detection signal S to better determine variation in delay time. In this case, the number of resistors and the number of pass gates of the delay compensating unit 310 may be adjusted according to the number of expanded detection signals S.

Next, the detailed operation of the delay compensating unit 310 of FIG. 6 will be described. Like A of FIG. 7, when the delay time is td, the detection signals S<3:5> may be low, high, and high, respectively. The resistors R11 and R12 may be connected in parallel with the second NAND gate ND12. The output of the first NAND gate ND11 may be delayed by the resistors R11 and R12 connected in parallel, and may then be input to the second NAND gate ND12. At this time, the total delay time of the main delay unit 300 may become td.

In the delay compensating unit 310 of FIG. 6, like B of FIG. 7, when the delay time is td+0.25×td, the detection signals S<3:5> may all be high, and thus the resistors R10, R11, and R12 may be connected in parallel with the second NAND gate ND12. The outputs of the first NAND gate ND11 may be delayed by the resistors R11, R12, and R13 connected in parallel and may then be input to the second NAND gate ND12.

At this time, when the resistors R11, R12, and R13 may be connected in parallel, the resistance may become smaller than the resistance when the resistors R11 and R12 are connected in parallel. The delay time decreases by 0.25×td compared with when the resistors R11 and R12 are connected in parallel. Accordingly, an increase of 0.25×td by the first and second NAND gates ND11 and ND12 may be decreased by the resistors R11 and R12. As a result, the total delay time of the main delay unit 300 may be kept to td.

In the delay compensating unit 310 of FIG. 6, like C of FIG. 7, when the delay time is td−0.25×td, the detection signals S<3:5> may be low, low, and high, respectively. Thus the resistor R12 may be the only resistor connected with the NAND gate ND12. The output of the first NAND gate ND11 may then be delayed by the resistor R12 and may then be input to the second NAND gate ND12.

The resistance when only the resistor R12 is connected may become larger than the resistance when the resistors R11 and R12 are connected in parallel. The delay time may increase by 0.25×td compared with when the resistors R11 and R12 are connected in parallel. Accordingly, a decrease of 0.25×td by the first and second NAND gates ND11 and ND12 may be increased by the resistors R11 and R12. As a result, the total delay time of main delay unit 300 may be kept to td.

Phase lead is a term well known in the art. Phase lead may describe when a second signal is delayed in comparison to a first signal. Phase lag is a term well known in the art. Phase lag may describe when a first signal is delayed in comparison to a second signal.

It will be apparent to those skilled in the art that various modifications and changes may be made without departing from the scope and spirit of the invention. Therefore, it should be understood that the above embodiment is not limiting, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

The delay line of the delay locked loop and the method of controlling a delay time according to an embodiment of the invention detects the variation in delay time according to the change in the operating environment and compensates the delay time accordingly. Therefore, the delay time may be consistently kept constant.

What is claimed is:

1. A semiconductor integrated circuit including a delay line of a delay locked loop, comprising:
   the delay line of the delay locked loop including:
   a delay variation detecting unit configured to receive a reference clock signal, to delay the reference clock signal for generating a plurality of delayed clock signals, to compare the reference clock signal with the plurality of the delayed clock signals, respectively, and to selectively enable a plurality of detection signals according to a variation in a delay time of the delayed clock signals, wherein the variation in the delay time is caused by changes of an operating voltage and an operating temperature, and the plurality of delayed clock signals have different delay times, respectively; and
   a plurality of delay units configured to receive the detection signals and an input signal, to determine a delay amount according to a number of enabled detection signals among the detection signals and to delay the input signal by the determined delay amount so as to compensate the variation in the delay time of the delay line according to the detection signals,
   wherein each of the delay units includes a first logic element having an output, a delay compensating unit configured to receive the detection signals and the output of the first logic element and delay the output of the first logic element by a delay time set according to the number of enabled detection signals of the detection signals, and a second logic element configured to receive the output of the delay compensating unit, and wherein the first logic element is a NAND gate or a NOR gate that has a first input terminal configured to receive the output of a previous delay unit or the reference clock signal, and a second input terminal, and is configured to operate as an inverter according to a level of the second input terminal.

2. The semiconductor integrated circuit including a delay line of a delay locked loop of claim 1,
   wherein the delay variation detecting unit includes:
   a plurality of sub delay units configured to receive the reference clock signal and sequentially delay the reference clock signal by a prescribed delay time, respectively and to output the delayed clock signals; and
   a plurality of phase detectors configured to receive the reference clock signal and the delayed clock signals and compare the reference clock signal and the delayed clock signals, respectively and output the detection signals.

3. The semiconductor inte grated circuit including a delay line of a delay locked loop of claim 2,
   wherein the sub delay unit includes:
   a first logic element configured to produce an output; and
   a second logic element configured to receive the output of the first logic element.

4. The semiconductor inte grated circuit including a delay line of a delay locked loop of claim 3,
   wherein the first logic element is a NAND gate or a NOR gate that has a first input terminal configured to receive the output of a previous sub delay unit or the reference clock signal, and a second input terminal, and is configured to operate as an inverter according to a level of the second input terminal.

5. The semiconductor integrated circuit including a delay line of a delay locked loop of claim 3,
   wherein the second logic element is a NAND gate or a NOR gate that has a first input terminal configured to receive the output of the first logic element as input, and a second input terminal, and is configured to operate as an inverter according to a level of the second input terminal.

6. The semiconductor integrated circuit including a delay line of a delay locked loop of claim 1,
wherein the delay compensating unit includes:
a plurality of resistors each having a first end configured to receive the output of the first logic element; and
a plurality of switching elements each having an input terminal correspondingly coupled to a second end of a resistor from the plurality of resistors, a control terminal configured to receive the detection signal, and output terminals commonly connected to one another.

7. The semiconductor integrated circuit including a delay line of a delay locked loop of claim 6,
wherein the plurality of resistors have the same resistance.

8. The semiconductor integrated circuit including a delay line of a delay locked loop of claim 6,
wherein the plurality of resistors have different resistances.

9. The semiconductor integrated circuit including a delay line of a delay locked loop of claim 6,
wherein the plurality of switching elements are pass gates.

* * * * *